(12) United States Patent
Saenger et al.

(10) Patent No.: US 7,071,122 B2
(45) Date of Patent: Jul. 4, 2006

(54) FIELD EFFECT TRANSISTOR WITH ETCHED-BACK GATE DIELECTRIC

(75) Inventors: Katherine L. Saenger, Ossining, NY (US); Rajarao Jammy, Hopewell Junction, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/730,892

(22) Filed: Dec. 10, 2003

(65) Prior Publication Data

US 2005/0127417 A1 Jun. 16, 2005

(51) Int. Cl.
*H01L 21/31* (2006.01)
(52) U.S. Cl. ..................................... 438/778
(58) Field of Classification Search ............... 438/689, 438/704, 705, 706, 745, 758, 778, 785
See application file for complete search history.

(56) References Cited

U.S. PATENT DOCUMENTS

| 2003/0104706 A1* | 6/2003 | Mitsuhashi et al. ......... 438/756 |
| 2004/0038538 A1* | 2/2004 | Ho et al. .................... 438/694 |

OTHER PUBLICATIONS

Morisaki et al. ( Ultra-thin (Teffinv = 1.7nm Poly-Si-gated SiN/HfO2/SiON High-k Stack Dielectrics with High Thermal Stability (1050 degrees C.)), Electron Devices Meeting, 2002. IEDM '02. Digest. International, Dec. 8-11, 2002, pp. 861-864.*

Ng et al. (Electrical Characteristics of Novel Hafnium Oxide Film), 2002, pp. 51-54.*
Zhan et al. (Characteristics of High Quality Hafnium Oxide gate Dielectric), 2002, pp. 43-46.*
Jakub Kedzierski, et al., Metal-gate FinFET and fully-depleted SOI devices using total gate silicidation, IBM Semiconductor Research and Development Center pp. 247-250.
B. Guillaumot, et al., 75nm Damascene Metal Gate and High-k Integration for Advanced CMOS Devices, Cedex France, Meylan France, Marseille France, pp. 355-358.
Katherine L. Saenger, et al., A Selective Etching Process for Chemically Inert High-k Oxides, Mat. Res. Soc. Symp. Proc. vol. 745 © 2003 Material Research Society, IBM Research Division, T.J. Watson Research Center.
Matsuo J. Yamada, et al., Surface processing by gas cluster ion beams at the atomic (molecular) level, Ion Beam Engineering Experimental Laboratory, Kyoto University, Sakyo, Kyoto 606, Japan.

* cited by examiner

*Primary Examiner*—Scott B. Geyer
(74) *Attorney, Agent, or Firm*—Connolly Bove Lodge & Hutz LLP; Robert M. Trepp

(57) ABSTRACT

A method for making an ultrathin high-k gate dielectric for use in a field effect transistor is provided. The method involves depositing a high-k gate dielectric material on a substrate and forming an ultrathin high-k dielectric by performing a thinning process on the high-k gate dielectric material. The process used to thin the high-k dielectric material can include at least one of any number of processes including wet etching, dry etching (including gas cluster ion beam (GCIB) processing), and hybrid damage/wet etching. In addition to the above, the present invention relates to an ultrathin high-k gate dielectric made for use in a field-effect transistor made by the above method.

16 Claims, 5 Drawing Sheets

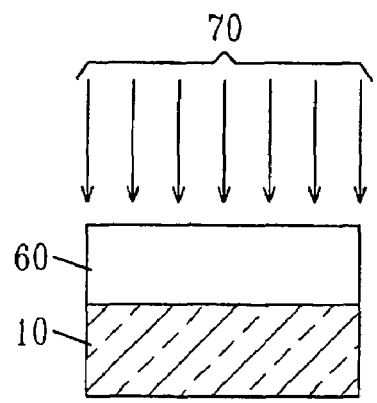
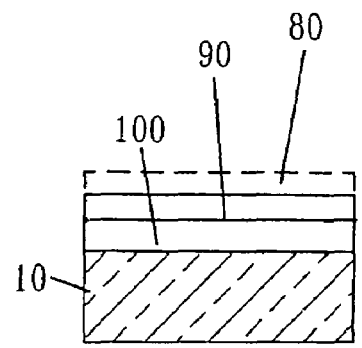
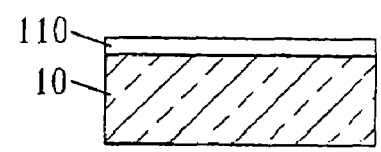
FIG. 2A  FIG. 2B  FIG. 2C
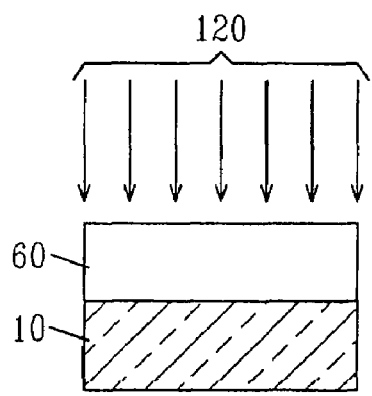
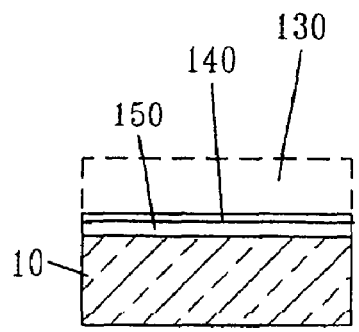
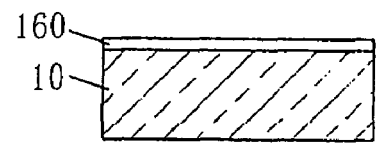
FIG. 2D  FIG. 2E  FIG. 2F

FIELD EFFECT TRANSISTOR WITH ETCHED-BACK GATE DIELECTRIC

FIELD OF THE INVENTION

This invention generally relates to field effect transistors (FETs) and complementary metal oxide semiconductor (CMOS) devices incorporating high-k gate dielectrics. More particularly, it relates to FETs having ultrathin high-k gate dielectrics formed by etching back or thinning a thicker high-k dielectric film, and to methods for making FETs with these etched-back gate dielectrics.

BACKGROUND OF THE INVENTION

Performance improvements in field effect transistors (FETs) are typically effected by shrinking the FET dimensions, a design approach known as scaling. As scaling drives gate dielectric dimensions to ever-thinner equivalent oxide thicknesses (EOTs), high dielectric constant (high-k) metal oxides and metal silicates are becoming increasingly attractive as candidate gate dielectric materials. The higher k of these materials (compared to $SiO_2$) allows them to have a thicker physical thickness for a given EOT, thus decreasing device leakage and improving the chances of acceptable leakage values for EOTs below 1 nm.

A general concern with the use of ultrathin (<2 nm) gate dielectrics (high-k or conventional) is film thickness control. Unintended thickness variations as small as one angstrom (A) can produce order of magnitude variations in the leakage of a 15A gate dielectric, a highly undesirable situation. On the other hand, it is becoming increasingly desirable to utilize different gate dielectric thicknesses in different parts of an integrated circuit. For example, the overall power consumption and speed of an integrated circuit may be optimized by utilizing an aggressively low EOT for circuit-critical devices (to give high performance) and a moderate EOT (low power consumption) for rest of the circuit's devices.

Despite the potential advantages, there are a number of possible concerns about using high-k materials as gate dielectrics in FET devices. For example, many high-k gate dielectrics may produce substantial reductions in Si mobility, an effect that may or may not be mitigated with the use of ultrathin high-k layers and/or specially designed interface layers. Thermal stability is also a possible concern with certain combinations of high-k dielectric and gate materials. Various methods of "nitriding" the high-k material's top surface have been investigated as a means to prevent unwanted interactions between a subsequently deposited conductive gate material and to reduce growth of unwanted interface layers. However, it can be difficult to achieve the desired concentration profile of nitrogen (quantity and depth distribution) without damaging the high-k film and/or semiconductor substrate.

Other concerns exist regarding the feasibility of scaling high-k gate dielectric materials such as $HfO_2$ to physical thicknesses below 1.5 to 2.0 nm. At early stages of growth, these films typically nucleate in islands and tend to be discontinuous. It is currently not clear that improvements to existing atomic layer chemical vapor deposition (ALCVD) and metal-organic chemical vapor deposition (MOCVD) processes (for example, introducing a change in precursors, deposition conditions, and/or new surface treatments) have the potential to produce continuous, defect-free films of the desired thickness.

Additional approaches for forming ultrathin high-k gate dielectrics for use in FETs (and for forming FETs with ultrathin high-k gate dielectrics) would thus be desirable in view of the problems described herein above.

SUMMARY OF THE INVENTION

The present invention provides a method for making an ultrathin high-k gate dielectric for use in a field effect transistor. The method includes depositing a high-k gate dielectric material on a substrate and forming an ultrathin high-k dielectric by performing a thinning process on the high-k gate dielectric material. The high-k gate dielectric material can, for example, have a dielectric constant of at least about 7, such as, for example, a dielectric constant ranging from about 10 to about 25. The ultrathin high-k dielectric can, for example, have a thickness of less than about 3 nm, such as, for example, a thickness of less than about 2 nm, such as a thickness ranging from about 1 nm to about 2 nm. The high-k dielectric material can, for example, be chosen from metal oxides, metal oxynitrides, metal silicon oxides, metal silicon oxynitrides, metal germanium oxides, metal germanium oxynitrides, and alloys, mixtures or multilayers of the same, where the metal may be selected from Al, Ba, Be, Bi, C, Ca, Ce, Co, Cr, Dy, Eu, Fe, Ga, Gd, Hf, In, La, Li, Mg, Mn, Mo, Nb, Ni, Pr, Sc, Sr, Ta, Ti, V, W, Y, Zn, and Zr.

The process used to thin the high-k dielectric material can include at least one of any number of processes including, for example, wet etching, dry etching, and/or hybrid damage/wet etching See, for example, K.L. Saenger et al., Mat. Res. Soc. Symp. Proc. 745 79 (2003). Following at least one thinning process, the high-k gate dielectric may optionally be subject to at least one post-thinning treatment, such as, for example, annealing in an inert ambient, annealing in a reactive ambient, and/or treating with plasma. In addition, additional material may optionally be added to the gate dielectric during or after thinning.

In another embodiment, the invention relates to an ultrathin high-k gate dielectric for use in a field effect transistor, wherein the process for making the gate dielectric includes depositing a high-k gate dielectric material on a substrate and forming an ultrathin high-k dielectric by performing a thinning process on said high-k gate dielectric material. The process for making the gate dielectric can further include at least one of the optional processing steps described above.

BRIEF DESCRIPTION OF THE DRAWINGS

These and other features of the present invention will become apparent upon consideration of the following detailed description of the invention when read in conjunction with the drawings, in which:

FIGS. 2A–2F show, in cross section view, examples of two different etch-back methods for producing an ultrathin gate dielectric;

DETAILED DESCRIPTION OF THE INVENTION

The present invention provides a method of making a field effect transistor with an ultrathin high-k gate dielectric. As used herein, a "high-k gate dielectric" generally refers to a dielectric material having a dielectric constant of, for example, at least about 7, such as, for example, a dielectric constant ranging from about 10 to about 25. As, used herein, an "ultrathin" high-k dielectric generally refers to a dielectric material having a thickness of, for example, less than about 3 nm, such as, for example, a thickness of less than about 2 nm, such as a thickness ranging from about 1 nm to about 2 nm. The ultrathin high-k gate dielectric of the FET is formed by etching back or thinning a thicker dielectric film. This etch-back approach can result in high-k dielectric films etched back to a thickness of less than 2 nm that are smoother and more continuous (and thus less leaky) than high-k films grown to this thickness directly. This etch-back approach can also facilitate the control and/or fine-tuning of the gate dielectric thickness, since film thicknesses can be reduced in selected areas after gate dielectric deposition or growth.

Gate dielectric thinning may be effected by any number of processes including wet etching (for example, in aqueous solutions containing HF), dry etching (for example, physical sputtering and/or reactive ion etching), and hybrid damage/wet etch processes (for example, low energy ion bombardment to form a surface damage layer followed by wet etching to remove the damage layer).

In one embodiment of the invention, the thinning is applied in a spatially selective manner to provide an integrated circuit comprising a plurality of FET devices with different gate dielectric thicknesses. In another embodiment of the invention, the thinning is applied in a spatially selective manner to correct an initial wafer-scale thickness nonconformity, thereby providing a plurality of FET devices with approximately the same gate dielectric thickness.

In yet another embodiment of the invention, additional material may be added to the gate dielectric during or after the thinning. For example, nitrogen may be added to the gate dielectric during thinning if the thinning is effected by a process such as gas cluster ion beam (GCIB) comprising nitrogen-containing gas clusters. Alternatively, the thinned dielectric might be overlaid or filled in with additional dielectric material to form a composite dielectric. For example, the thinned dielectric could function as a seed layer for regrowth of additional high-k dielectric, or as a matrix into which or onto which additional dielectric material could be deposited (or grown by oxidation or nitridation of materials already on or in the substrate).

In embodiments relating to the invention, the resulting thinned dielectric may be annealed (in reactive or inert ambients) or otherwise treated to repair damage and to improve device properties.

Figure 1A:
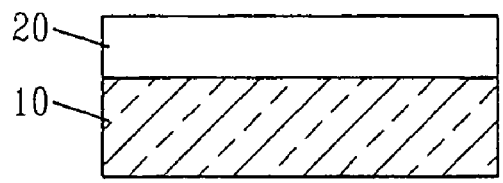
FIGS. 1A–1D show, in cross section view, steps of a method relating to the invention for making one or more field effect transistors having an ultrathin high-k-containing gate dielectric.
Figure 1B:
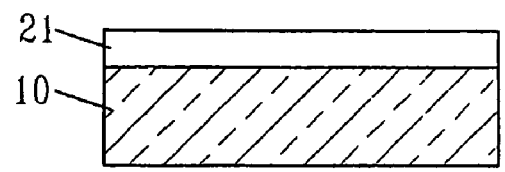
Figure 1C:
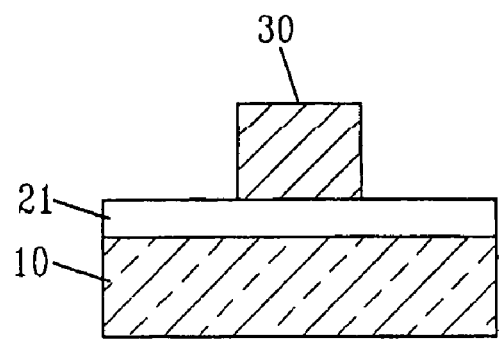
Figure 1D:
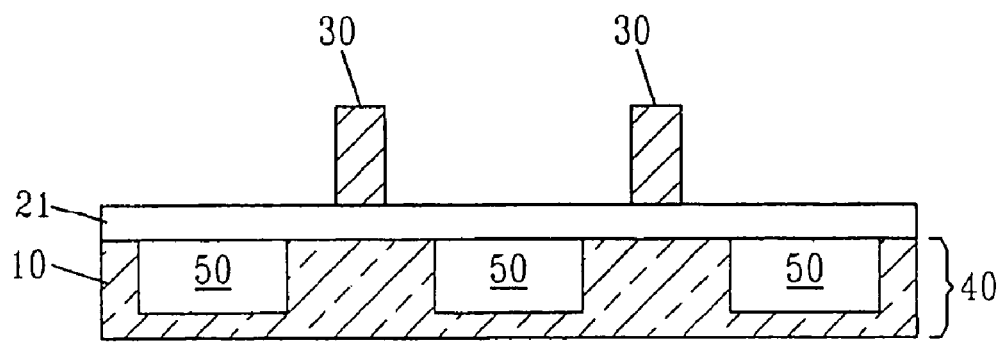

One embodiment relating to the invention is shown in FIGS. 1A–1D. FIG. 1A shows semiconductor substrate 10 after deposition of high-k gate dielectric 20. FIG. 1B shows the structure of FIG. 1A after high-k gate dielectric 20 has been thinned or etched-back to form ultrathin high-k gate dielectric 21. FIG. 1C shows the structure of FIG. 1B after deposition and patterning of conductive gate structure 30, before further processing to form source and drain regions (not shown). FIG. 1D shows how thinned dielectric 21 of FIG. 1C might be used to form multiple FET devices on composite substrate 40 containing semiconductor regions 10 and insulating shallow trench isolation regions 50.

It should be noted that the same etch-back process may be used to form ultrathin high-k gate dielectrics for FETs of other designs, see, for example, Kedzierski et al., "Metal-gate FinFET and fully-depleted SOI devices using total gate silicidation", IEDM Tech. Digest, p 247 (2002), or other process flows, for example, a replacement gate process flow, see, e.g., Guillaumot et al., "75 nm Damascene Metal Gate and High-k Integration for Advanced CMOS Devices", IEDM Tech. Digest, p 355 (2002).

High-k gate dielectric 20 may comprise any metal oxide, metal oxynitride, metal silicon oxide, metal silicon oxynitride, metal germanium oxide, or metal germanium oxynitride well as alloys, mixtures or multilayers of the aforementioned materials. The metal or metals of the metal oxide, metal oxynitride, metal silicon oxide, metal silicon oxynitride, metal germanium oxide, or metal germanium oxynitride may, for example, be selected from the group consisting of Al, Ba, Be, Bi, C, Ca, Ce, Co, Cr, Dy, Eu, Fe, Ga, Gd, Hf, In, La, Li, Mg, Mn, Mo, Nb, Ni, Pr, Sc, Sr, Ta, Ti, V, W, Y, Zn, and Zr.

In addition, high-k gate dielectric 20 may comprise an additional one or more layers of a metal-free dielectric, for example, a layer of a silicon or germanium oxide, silicon or germanium oxynitride, or silicon or germanium nitride at the substrate interface or as a component of a multilayer dielectric stack High-k gate dielectric 20 may optionally be annealed prior to thinning. Annealing may be, for example, at temperatures ranging from the dielectric deposition temperature to about 1200° C., preferably at temperatures in the range of about 400° C. to about 1100° C., and more preferably at temperatures in the range of about 600° C. to about 1000° C. Annealing may be for times ranging from about 1 second to several hours, such as from about 1 minute to about 10 minutes. Annealing may, for example, be in reactive or inert ambients, which may, for example, include gases, plasmas, and/or radicals selected or generated from He, $H_2$, Ar, Kr, Xe, $N_2$, $O_2$, $H_2O$, $CH_4$, $CO_2$, $NH_3$, other carbon-containing gases, other nitrogen-containing gases, other hydrogen-containing gases, other oxygen-containing gases, halogen-containing gases, and mixtures of any of the aforementioned gases.

The thinning of high-k gate dielectric 20 may be effected by any number of processes including wet etching alone (for example, etching in aqueous solutions containing HF), dry etching (for example, physical sputtering reactive ion etching, and/or gas cluster ion beam (GCIB) processing), and hybrid damage/wet etching (for example, low energy ion bombardment or implantation to form a surface damage layer followed by wet etching to remove the damage layer). Hybrid damage/wet etching processes, are for example, described in U.S. Patent Application Publication No. US 2003/0104706 to Mitsuhashi et al. They are also described in U.S. patent application Ser. No. 10/170914 to D. A. Buchanan et al., filed Jun. 13, 2002, the entire contents of which are incorporated herein by reference.

A pre-thinning crystallization anneal may be particularly desirable for cases in which (i) the thinning process involves a wet etch step, and (ii) dielectric 20 comprises a spatially inhomogeneous mixture of crystalline and amorphous regions with different wet etch sensitivities. For example, certain $HfO_2$ films may require very aggressive anneals (for example, 1 min at 1000° C. in $N_2$) to completely crystallize the film's bottom 1–2 nm. Wet etching of incompletely crystallized films will typically produce roughening if a film's amorphous regions are etched when its crystalline regions are not.

Ultrathin high-k gate dielectric 21, produced by thinning high-k dielectric 20, may optionally be subjected to at least one post-thinning treatment. For example, ultrathin high-k gate dielectric may be annealed (in reactive or inert ambients) or otherwise treated (with a plasma, for example) to repair any processing damage and to improve gate dielectric properties. Reactive inert ambients which may be useful in this regard, include, for example, gases, plasmas, and/or radicals selected or generated from the following gases: He, $H_2$, Ar, Kr, Xe, $N_2$, $O_2$, $H_2O$, $CH_4$, $CO_2$, and $NH_3$. Other reactive inert ambients which may have potential application include other carbon-containing gases, other nitrogen-containing gases, other hydrogen-containing gases, other oxygen-containing gases, halogen-containing gases, and mixtures of any of the aforementioned gases.

FIGS. 2A–2F show examples of two different etch-back methods for producing an ultrathin high-k gate dielectric. FIGS. 2A–2C illustrate the steps of a hybrid damage/wet etch process for thinning FIG. 2A shows dielectric 60 (which is to be thinned) on substrate 10. If desired, dielectric 60 may be annealed in an inert or (alternatively) a reactive ambient prior to the thinning process. Dielectric 60 is then subjected to energetic particle bombardment 70. As shown in FIG. 2B, energetic particle bombardment 70 will typically remove a small portion of the dielectric by sputtering (denoted by region 80). Energetic particle bombardment 70 will also leave damage layer 90, and undamaged (or low-damage) layer 100. Damage layer 90 is then selectively removed by a wet etch process that does not attack undamaged (or low damage) layer 100. Layer 100 is then optionally annealed in an inert or (alternatively) a reactive ambient or otherwise treated (with a plasma, for example) to repair any processing damage and to improve gate dielectric properties, to leave ultrathin high-k gate dielectric 110.

Energetic particle bombardment 70 would typically be implemented by an ion beam etch, plasma etch, or reactive ion etch process.

FIGS. 2D–2F illustrate the steps of a dry etching process for thinning gate dielectric 60 on substrate 10. If desired, dielectric 60 may be annealed in an inert or (alternatively) a reactive ambient prior to the thinning process. Dielectric 60 is then subjected to energetic particle bombardment 120. In contrast to damage-generating bombardment 70 of FIG. 2A, bombardment 120 of FIG. 2D acts primarily to remove material. Bombardment 120, like bombardment 70, would typically be implemented by means of an ion beam etch, plasma etch, or reactive ion etch process, though bombardment 120 would typically be at lower energies and/or for longer times. As shown in FIG. 2E, bombardment 120 removes a substantial portion of the dielectric (denoted by region 130), leaving a thin damage layer 140, and undamaged (or low-damage) layer 150. Layers 140 and 150 are then optionally annealed to repair any residual processing damage to produce ultrathin high-k gate dielectric layer 160 of FIG. 2F.

Examples of ion beam etch, plasma etch, or reactive ion etch processes used for bombardment 120 might include physical sputter etching in an inert gas such as Ar, or gas cluster ion beam (GCIB) processing with halogen-containing cluster ions. GCIB processing is an emerging technology with application in high-precision, relatively damage-free smoothing and thinning of thin films used in semiconductor device manufacturing. In GCIB, gas cluster ions of about 1,000 (or lower) to about 30,000 atoms or molecules at about 1 keV to about 30 keV (about 1 eV per atom) are directed towards the film to be thinned. The clusters are in a collimated beam which scans the film using preprogrammed dwell times. The clusters can be formed from a single element (e.g., clusters of Ar, $N_2$, or $O_2$) or from multiple elements (e.g., Ar with a few percent of a reactive containing gas such as $CF_4$, $SF_6$, $NH_3$, or $O_2$). Upon impact with the workpiece the clusters decompose into their atomic constituents and react and/or modify the workpiece surface. For a general discussion of GCIB, see, e.g., Yamada, et al., "Surface processing by gas cluster ion beams at the atomic (molecular) level," J. Vac. Sci. Technol., A 14 781 (1996), the entire disclosure of which is incorporated herein by reference.

Figure 3A:
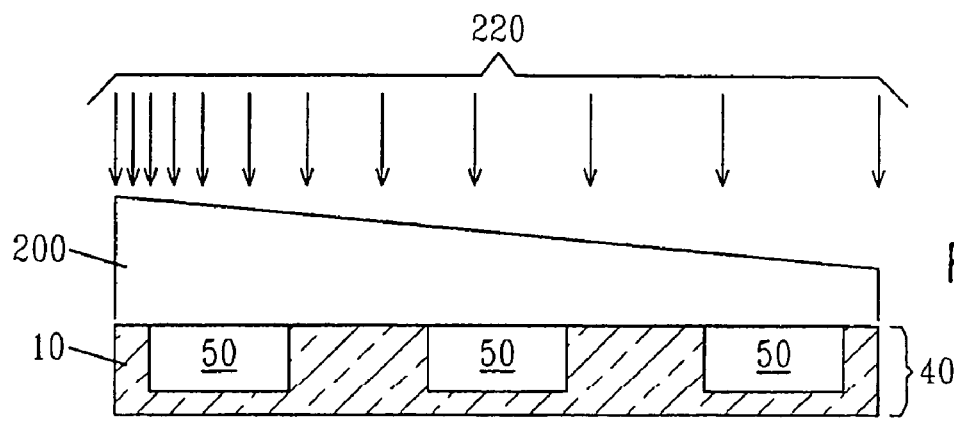
FIGS. 3A–3D show, in cross section view, how an etch-back or thinning process might be used in a spatially selective manner to improve the thickness uniformity of a gate dielectric (3A–3B) or to provide gate dielectrics of two different thicknesses (3C–3D) for the field effect transistors of FIG. 1D.
Figure 3B:
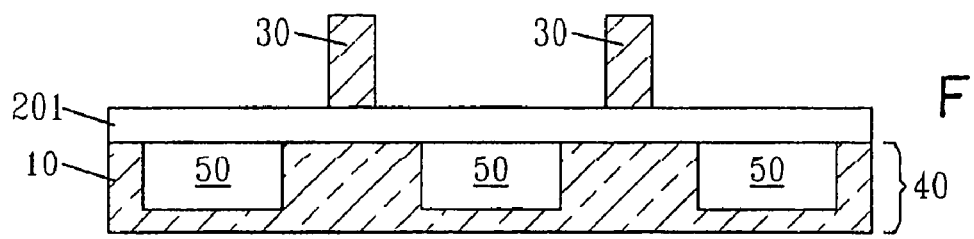

FIGS. 3A–3B show how an embodiment of the invention in which an etch-back or thinning process is used in a spatially selective manner to improve the thickness uniformity of an initially nonuniform gate dielectric. Nonuniform gate dielectric 200 in FIG. 3A is subjected to a nonuniform thinning process 220. Nonuniform thinning process 220 may be, for example, GCIB etching with a collimated beam whose scanning rate is programmed to provide longer dwell times where the film is thicker. Scanning rates (or dwell times) may be programmed before the thinning process begins, or set during the thinning process, for example, by using a feedback loop in combination with a metrology tool. FIG. 3B shows the resulting uniform-thickness ultrathin high-k gate dielectric 201 with FET gates 30. As with the above embodiments, ultrathin high-k gate dielectric 201 may be optionally annealed (in inert or reactive ambients) or otherwise treated (with a plasma, for example) to repair any processing damage and to improve gate dielectric properties.

Figure 3C:
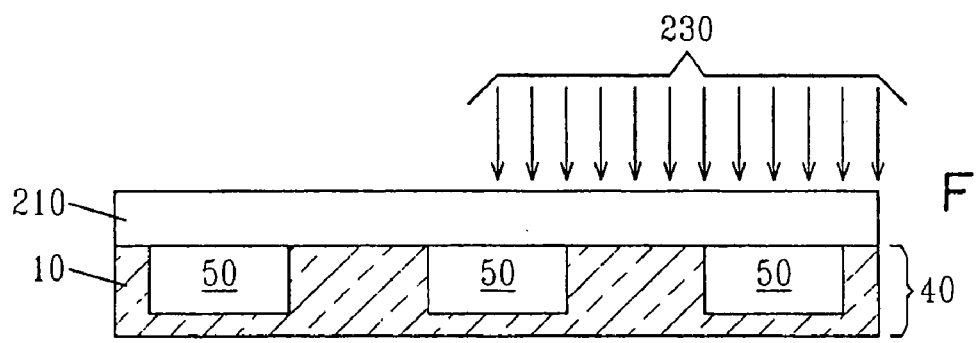
Figure 3D:
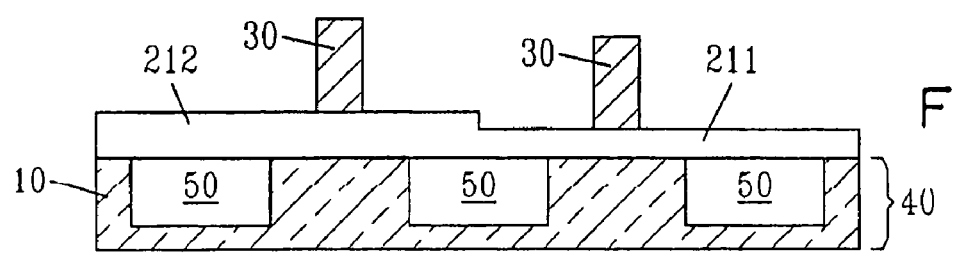

FIGS. 3C–3D show an embodiment of the invention in which thinning may be applied in a spatially selective manner to provide an integrated circuit comprising a plurality of FET devices with different gate dielectric thicknesses. Uniform gate dielectric 210 in FIG. 3C is subjected to a nonuniform thinning process. The nonuniform thinning process may be, for example, a uniform thinning process applied through openings in a mask, or (as shown in FIG. 3C), maskless thinning process 230 that is applied in a spatially selective manner. FIG. 3D shows gates 30 on the resulting gate dielectric 211/212 comprising gate dielectric 212 with a first thickness and ultrathin high-k gate dielectric 211 with a second thickness different from the first. As before, ultrathin high-k gate dielectric 201 may be optionally annealed (in inert or reactive ambients) or otherwise treated (with a plasma, for example) to repair any processing damage and to improve gate dielectric properties. If more than two thicknesses of gate dielectric are desired for the FETs, additional regions of gate dielectric can be thinned with the same approach.

It should be noted that the spatially selective etch-back process of FIGS. 3C–3D may also be used to form one or more capacitors with different dielectric thicknesses. This may be useful for the case of on-chip capacitors, if a range of different capacitances are needed from capacitors having the same area, or if thinning is preferable to increasing the capacitor area when a larger capacitance is desired. For example, one might deposit a layer of $HfO_2$ and an overlayer of $HfSiO_x$ to form a bilayer $HfO_2/HfSiO_x$ on-chip capacitor dielectric, and then selectively wet etch the $HfSiO_x$ dielectric in selected areas to leave a single layer of $HfO_2$.

Figure 4A:
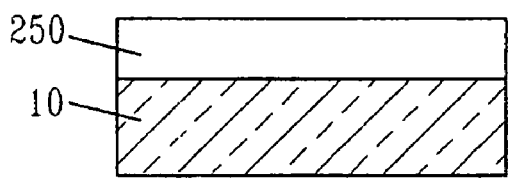
FIGS. 4A–4E show, in cross section view, examples of two different methods of adding material to an etched-back gate dielectric.
Figure 4B:
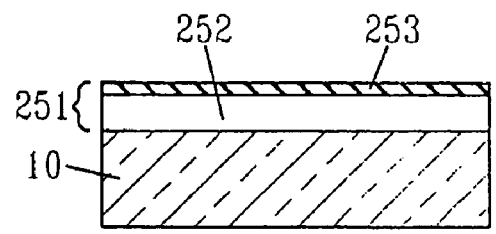

In yet another embodiment of the invention, additional material may be added to the gate dielectric during or after the thinning. For example, FIGS. 4A–4B show how nitrogen may be added to the gate dielectric during thinning if the thinning is effected by an ion beam or GCIB comprising nitrogen-containing ions. FIG. 4A shows gate dielectric 250 prior to thinning. FIG. 4B shows thinned gate dielectric 251 with bottom layer 252 and nitrided surface layer 253. In addition to nitrogen, other elements may be added to the gate dielectric during or after the thinning. These may include, for example, Al, B, Ba, Be, Bi, Br, C, Ca, Ce, Cl, Co, Cr, Dy, Eu, F, Fe, Ga, Gd, Ge, H, Hf, In, La, Li, Mg, Mn, Mo, Nb, Ni, 0, P, Pr, S, Sc, Sr, Si, Sn, Ta, Ti, V, W, Y, Zn, and Zr.

Figure 4C:
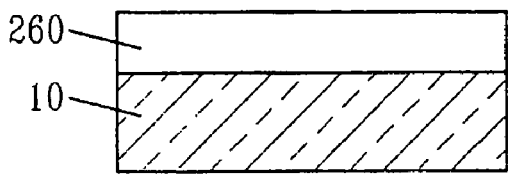
Figure 4D:
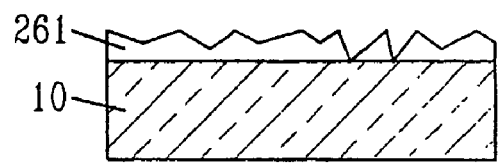
Figure 4E:
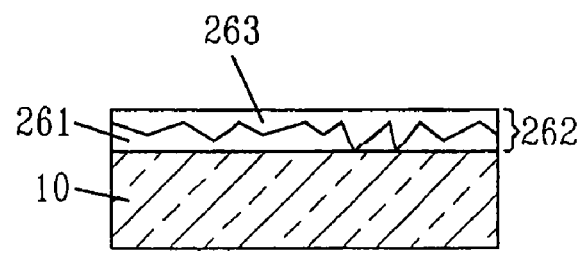

Alternatively, the thinned dielectric might be overlaid or filled in with additional dielectric material to form a composite dielectric. For example, the thinned dielectric could function as a seed layer for regrowth of additional high-k dielectric, or as a matrix into which or onto which additional dielectric material could be deposited (or grown by oxidation or nitridation of materials already on or in the substrate). This approach is illustrated in FIGS. 4C–4E. FIG. 4C shows gate dielectric 260 prior to thinning. FIG. 4D shows partially continuous gate dielectric layer 261 produced by a thinning process that also produced roughening. FIG. 4E shows composite gate dielectric 262 comprising thinned gate dielectric layer 261 and additional dielectric layer 263. As in previous embodiments, composite gate dielectric layer 262 may be annealed (in reactive or inert ambients) or otherwise treated (with a plasma, for example) to repair any processing damage and to improve gate dielectric properties.

The following examples describe high-k dielectric thinning for three exemplary cases: (1) a $HfO_2$ film thinned without roughening from about 5 nm to about 3 nm by an Ar damage/wet etch technique, (2) a $HfO_2$ film thinned (with some roughening) from about 3 nm to about 1 nm by an Ar damage/wet etch technique, and (3) a $HfO_2$ film thinned from about 3 nm to about 2 nm by Ar sputter etching. In all cases, the $HfO_2$ was deposited by MOCVD on a 100-oriented single crystal Si wafer substrates treated in a "standard clean 1" solution of $NH_4OH$ and $H_2O_2$ to produce a thin (approximately 0.5–1.0 nm) layer of chemical silicon dioxide. Wet etching was performed in 10:1 dilute HF (dHF) solution with 5 wt % HF and 95% $H_2O$. $HfO_2$ thicknesses were determined from Rutherford Backscattering Spectroscopy (RBS) measurements of Hf areal density (atoms/cm$^2$) and the assumption of bulk density for the $HfO_2$.

EXAMPLE 1

Figure 5A:
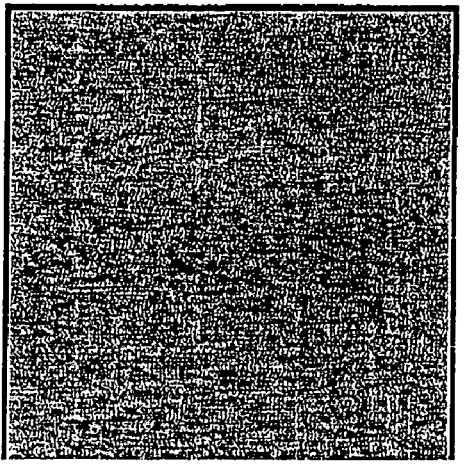
FIGS. 5A–5F show atomic force microscope images before and after three thinning processes.
Figure 5B:
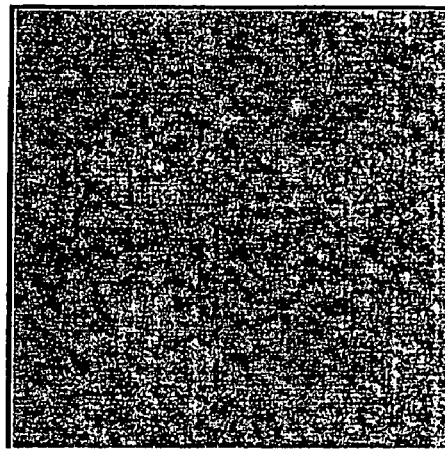

An Approximately 5 nm $HfO_2$ Film is Thinned to About 3 nm Without Substantial Roughening An approximately 4.5 nm thick film of $HfO_2$, impervious to dHF as-deposited, was given an Ar reactive ion etch (RIE) damage treatment in a LAM9400 RIE tool. The conditions were: an Ar pressure of 5 mTorr, an Ar flow of 60 sccm, a top power of 100 W, a bottom power of 300 W, and a self-bias of 160 Vdc, for 10 seconds. The RIE treatment removed about 0–0.5 nm of $HfO_2$. A 30 sec treatment in dHF reduced the film thickness to about 3.2 nm. FIGS. 5A–5B show atomic force microscope (AFM) images of the film before (FIG. 5A) and after (FIG. 5B) the damage/wet etch process. Film roughness was similar before and after the thinning: rms/peak-to-valley roughness was about 2.2/7.6 A (before) and about 2.1/7.8 A (after).

EXAMPLE 2

Figure 5C:
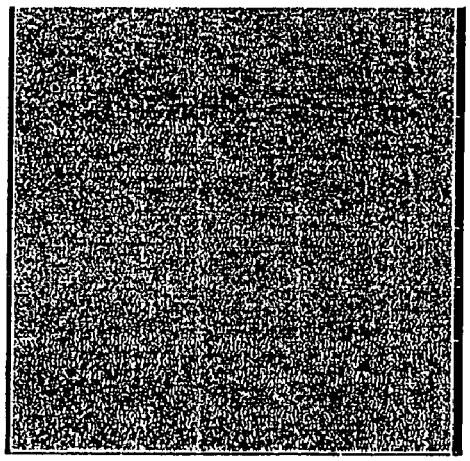
Figure 5D:
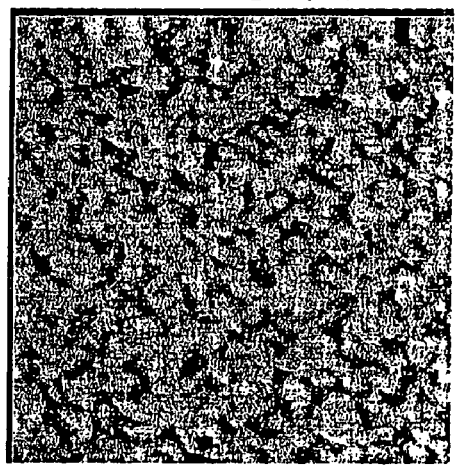

An Approximately 3 nm $HfO_2$ Film is Thinned to About 1 nm With Some Roughening An approximately 3.1 nm thick film of $HfO_2$ was annealed in $N_2$ at 700° C. for 30 sec to make it impervious to dHF. The film was then given an Ar RIE damage treatment in a LAM9400 RIE tool. The conditions were: an Ar pressure of 5 mTorr, an Ar flow of 60 sccm, a top power of 100 W, a bottom power of 100 W, and a self-bias of 60 Vdc for 30 sec. The RIE treatment removed about 0.6 nm of $HfO_2$. A 2 min treatment in dHF reduced the film thickness to about 1.1 nm. FIGS. 5C–5D show AFM images of the film before (FIG. 5C) and after (FIG. 5D) the damage/wet etch process. Film roughness was substantially greater after the thinning: rms/peak-to-valley roughness was about 2.2/6.2 A (before) and about 4.7/19 A (after).

This roughening was attributed to an insufficiently aggressive crystallization anneal (700° C. at 30 seconds in $N_2$), which left the bottom 1–2 nm of the $HfO_2$ film a mixture of crystalline regions (which were not attacked by dHF) and amorphous regions (which were attacked by dHF). Smoother films would generally be expected if the amorphous regions of the $HfO_2$ were better crystallized prior to thinning (e.g., with a more aggressive crystallization anneal).

EXAMPLE 3

Figure 5E:
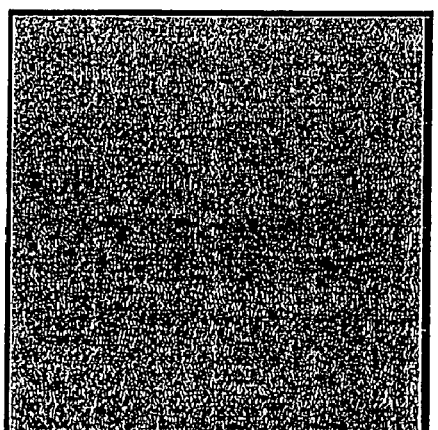
Figure 5F:
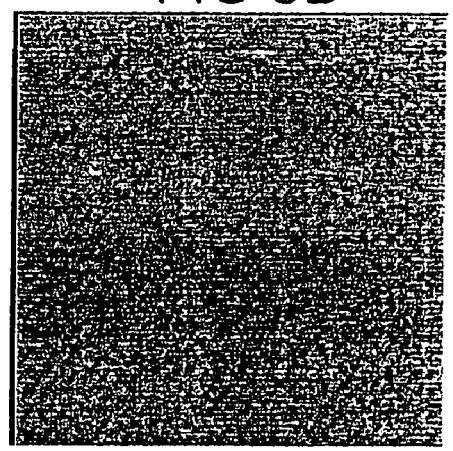

A $HfO_2$ Film is Thinned from About 3 nm to About 2 nm By Ar Sputter Etching Without Substantial Roughening An approximately 3 nm thick film of $HfO_2$, etchable in dHF as-deposited, was given an Ar RIE thinning treatment in a Unaxis 790 series RIE tool. The conditions were: an Ar pressure of 20 mTorr, an Ar flow of 20 sccm, a bottom power of 200 W, and a self-bias of 420 Vdc, for 2 min. The RIE treatment removed about 1.0 nm of $HfO_2$. The film was annealed in $N_2$ at 700° C. for 1 min to repair any residual RIE damage. FIGS. 5E–5F show AFM images of the film before (FIG. 5E) and after (FIG. 5F) the thinning process. Film roughness was similar before and after thinning: rms/peak-to-valley roughness was about 2.2/6.5 A (before) and about 2.1/6.6 A (after).

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. In particular, the examples given are intended to be illustrative rather than exclusive, and exemplary rather than prescriptive.

What is claimed as new and desired to be protected by Letters Patent of the United States is:

1. A method for making an ultrathin high-k gate dielectric for use in a field effect transistor comprising:
   depositing a high-k gate dielectric material on a substrate;
   forming an ultrathin high-k dielectric by performing a thinning process on said high-k gate dielectric material, wherein the ultrathin high-k dielectric has a thickness of less than about 3 nm; and, following the thinning process,
   forming a conductive gate structure on said ultrathin high-k dielectric;

wherein the thinning process comprises at least one etching process.

2. The method of claim 1, wherein the high-k gate dielectric material has a dielectric constant of at least about 7, and the ultrathin high-k gate dielectric has a thickness of less than about 2 nm.

3. The method of claim 2, wherein the high-k gate dielectric material has a dielectric constant ranging from about 10 to about 25, and the ultrathin high-k gate dielectric has a thickness ranging from about 1 nm to about 2 nm.

4. The method of claim 3, wherein the high-k dielectric material is selected from the group consisting of a metal oxide, a metal oxynitride, a metal silicon oxide, a metal silicon oxynitride, a metal germanium oxide, a metal germanium oxynitride, and alloys, mixtures, or multilayers of the same; wherein the metal is selected from the group consisting of Al, Ba, Be, Bi, C, Ca, Ce, Co, Cr, Dy, Eu, Fe, Ga, Gd, Hf, In, La, Li, Mg, Mn, Mo, Nb, Ni, Pr, Sc, Sr, Ta, Ti, V, W, Y, Zn, and Zr.

5. The method of claim 4, wherein the high-k dielectric material comprises $HfO_2$.

6. The method of claim 4, further comprising depositing at least one interfacial layer of a metal-free dielectric material between the substrate and the high-k gate dielectric.

7. The method of claim 6, wherein the metal-free dielectric material is selected from the group consisting of silicon oxide, germanium oxide, silicon oxynitride, germanium oxynitride, silicon nitride, and germanium nitride.

8. The method of claim 1, wherein the thinning process is selected from the group consisting of wet etching, dry etching, and hybrid damage/wet etching.

9. The method of claim 8, wherein the dry etching process is selected from the group consisting of physical sputtering, ion beam etching, reactive ion etching, and gas cluster ion beam (GCIB) processing.

10. The method of claim 8, wherein the thinning process comprises hybrid damage/wet etching treatment.

11. The method of claim 10, wherein the hybrid damage/wet etching treatment comprises an argon reactive ion etch as the damage treatment.

12. The method of claim 1, further comprising a post-thinning treatment of the high-k dielectric material.

13. The method of claim 12, wherein the post-thinning treatment is selected from the group consisting of annealing in an inert ambient, annealing in a reactive ambient, and treating with plasma.

14. The method of claim 1, further comprising adding additional material to the gate dielectric during or after the thinning, wherein the additional material is selected from the group consisting of Al, B, Ba, Be, Bi, Br, C, Ca, Ce, Cl, Co, Cr, Dy, Eu, F, Fe, Ga, Gd, Ge, H, Hf, In, La, Li, Mg, Mn, Mo, N, Nb, Ni, O, P, Pr, S, Sc, Si, Sn, Sr, Ta, Ti, V, W, Y, Zn, and Zr.

15. The method of claim 14, wherein the additional material comprises N.

16. The method of claim 1, further comprising annealing said high-k dielectric material prior to performing said thinning process.

* * * * *